US007227485B2

(12) United States Patent
Hiscocks

(10) Patent No.: US 7,227,485 B2
(45) Date of Patent: Jun. 5, 2007

(54) WAVEFORM CONTROL CIRCUIT

(76) Inventor: Peter Duncan Hiscocks, 55 Grandview Ave., Toronto (CA) M4K 1J1

( * ) Notice: Subject to any disclaimer, the term of this patent is extended or adjusted under 35 U.S.C. 154(b) by 0 days.

(21) Appl. No.: 11/242,144

(22) Filed: Oct. 4, 2005

(65) Prior Publication Data

US 2006/0077085 A1 Apr. 13, 2006

Related U.S. Application Data

(60) Provisional application No. 60/614,965, filed on Oct. 4, 2004.

(51) Int. Cl.
*H03M 1/66* (2006.01)

(52) U.S. Cl. .................................................... 341/145

(58) Field of Classification Search ................ 341/135, 341/144, 120, 118, 145, 147, 144, 145; 360/78.04; 702/120

See application file for complete search history.

(56) References Cited

U.S. PATENT DOCUMENTS 6,816,099 B2 * 11/2004 Brauns et al. ............. 341/153
2005/0151573 A1 * 7/2005 Gao .......................... 327/263

* cited by examiner

*Primary Examiner*—Brian Young
(74) *Attorney, Agent, or Firm*—Nancy E. Hill; Hill & Schumacher

(57) ABSTRACT

The waveform conform control circuit includes a waveform generator, an amplitude adjustment device and an offset device. The waveform generator produces a current waveform. The amplitude adjustment device receives amplitudes amplitude data and produces a predetermined scale factor which is applied to the basic current waveform to produce a scaled current waveform. The offset device is a digital to analog converter for receiving offset data and producing a predetermined scale value that is added to the scaled waveform to produce a final current waveform. A method a digitally generated waveform is also disclosed. An offset circuit using current steering digital to analog and a current mirror is also disclosed.

23 Claims, 10 Drawing Sheets

WAVEFORM CONTROL CIRCUIT

CROSS REFERENCE TO RELATED PATENT APPLICATION

This patent application relates to U.S. Provisional Patent Application Ser. No. 60/614,965 filed on Oct. 4, 2004 entitled MULTIFUNCTION ELECTRONIC VIRTUAL INSTRUMENT AND WAVEFORM CONTROL CIRCUIT FOR USE IN SAME.

FIELD OF INVENTION

The invention relates to a waveform control circuit and in particular a waveform circuit in which the amplitude and the offset of the output waveform are controlled by current steering digital to analog converters.

BACKGROUND OF INVENTION

The waveform generator or function generator is a commonly-used unit of test equipment in an electronics lab. The function generator produces various electrical waveforms that may be adjusted in frequency, amplitude and offset. In such a device the waveforms are generated by analog circuitry. Adjustments of amplitude were performed by front panel controls (potentiometers) that operated directly on the analog waveform signal. The final signal is then amplified and fed to an output connector.

It is now common practice to use various digital methods to generate the waveforms. This facilitates the use of certain devices such as computer control and the generation of arbitrary waveforms. Since the generation of the shape and frequency of the basic waveform is by means of digital circuitry, it is attractive to control the amplitude and offset by digital methods. Then the entire instrument may be controlled by digital commands. The shape and frequency of the waveform are created by a microprocessor or special-purpose digital hardware that generates a stream of numbers. Each number represents a point on the waveform. Then this stream of digital numbers may be converted into a waveform of voltage or current versus time by a digital-analog converter.

In one possible well known implementation, adjustment of the amplitude and offset is performed as digital number manipulations in the microprocessor or digital hardware, preceding the digital-analog conversion. The amplitude adjustment is performed by multiplying the waveform data by a constant value. The offset adjustment is performed by further adding a constant value. However, performing these arithmetic operations at the speed necessary to generate a reasonable frequency waveform requires a powerful microprocessor (DSP, digital signal processor) or special purpose hardware. As well, the digital-analog converter must have high precision since it must accommodate the entire dynamic range of the output, including the waveform and its DC offset.

Accordingly it would be advantageous to provide a device and a means for controlling a digitally generated waveform that is relatively inexpensive to manufacture. Further it would be advantageous to produce such a device that functions at high speed.

SUMMARY OF THE INVENTION

The present invention is directed to a method of controlling a digitally generated waveform comprising the steps of: receiving waveform data into a first digital to analog converter to produce a basic current waveform; receiving amplitude data into a second digital to analog converter to produce a predetermined scale factor which is applied to the basic current waveform to produce a scaled current waveform; receiving offset data into a third digital to analog converter to produce a predetermined scale value that is added to the scaled current waveform to produce a final current waveform.

Another aspect of the invention is directed to a device for controlling a digitally generated waveform comprising: a means for producing a basic current waveform; a means for receiving amplitude data and producing a predetermined scale factor which is applied to the basic waveform to produce a scaled current waveform; an offset digital to analog converter for receiving offset data and producing a predetermined scale value that is added to the scaled waveform to produce a final current waveform.

In a further aspect of the invention A circuit for offsetting a waveform comprising: a means for generating a current waveform and a complementary current waveform; a current steering digital to analog converter having complementary current output terminals; a current mirror wherein the complementary current output terminals of the current steering digital to analog converter are operably connected to the current mirror through the current waveform and the complementary current waveform to produce an offset current waveform.

This invention describes a novel form of the amplitude and offset control sections of a digital waveform generator. In present invention, the waveform is generated as usual by a digital-analog converter (DAC) and then the amplitude and offset are adjusted by two additional digital-analog converters. Then, if a microprocessor is used to generate the waveform data, it can be a simple low-cost device. Furthermore, although one digital-analog converter is required for control of amplitude and a second digital-analog converter for control of offset, these DACs and the waveform DAC can be modest precision, low-cost devices.

BRIEF DESCRIPTION OF THE DRAWINGS

The invention will now be described by way of example only, with reference to the accompanying drawings, in which.

DETAILED DESCRIPTION OF THE INVENTION

Prior to the detailed discussion of the invention herein, a more detailed discussion of the prior art serves to provide a better context of the invention.

Prior Art

Digital Computation of Offset

In order to understand the advantage of the circuit described herein, consider the generation of the offset waveform by entirely digital means. For simplicity, we consider specific numbers of bits in the digital information. However, the same concept is general and can be extended to other resolutions.

Figure 1:
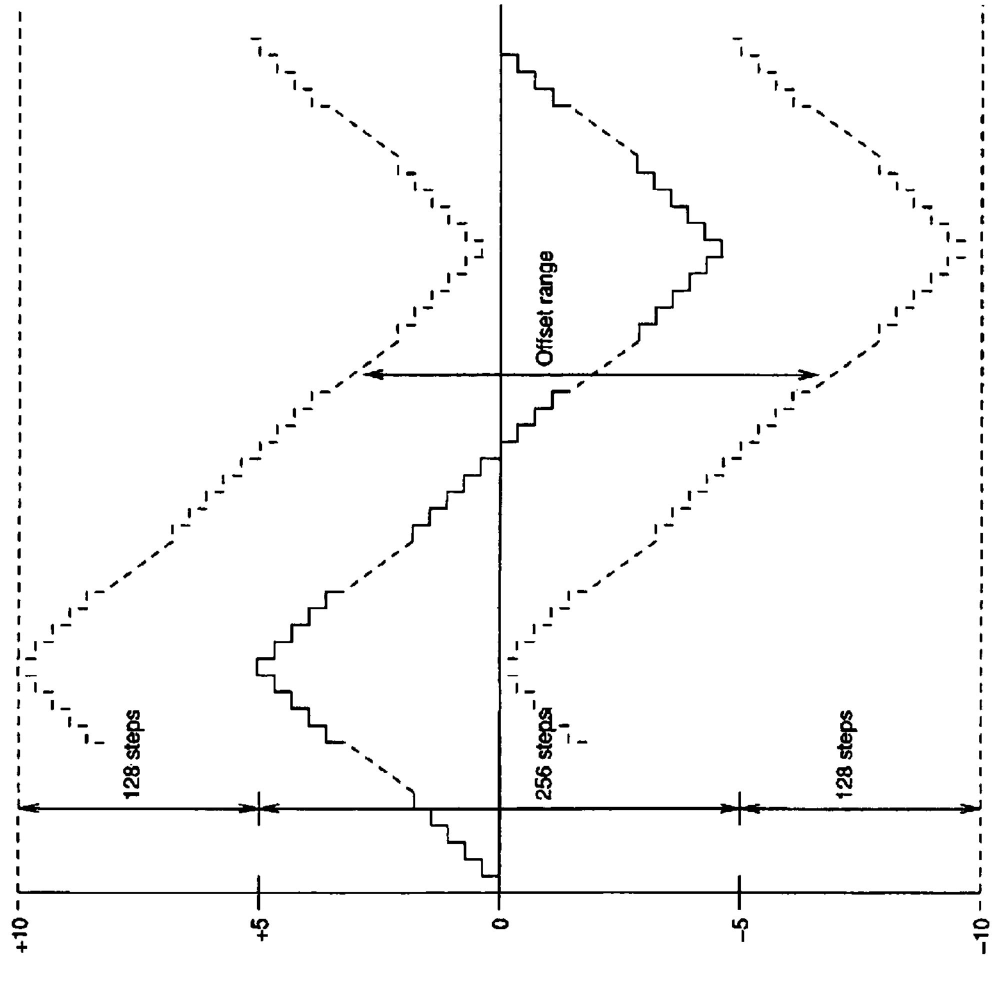
(PRIOR ART) FIGURE 1
FIG. 1 is a graph of a digital wave form that is offset using a prior art method.
Figure 2:
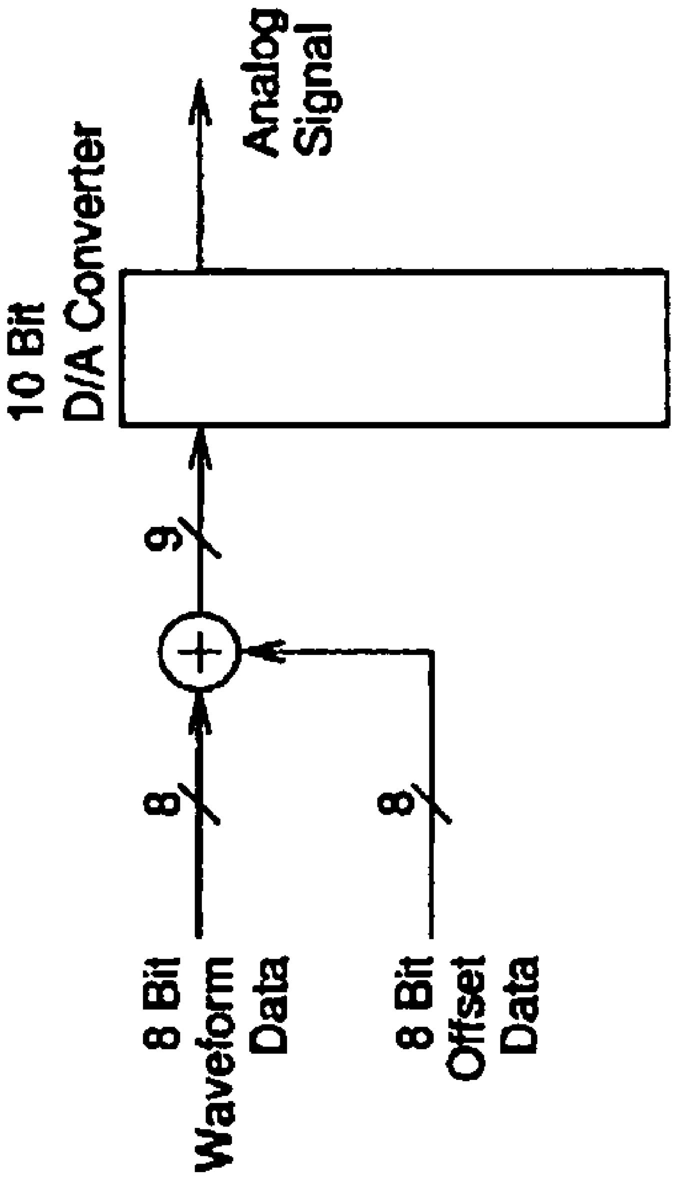
(PRIOR ART) FIGURE 2
FIG. 2 is a block diagram of a prior art circuit used to offset the digital waveform of FIG. 1.

Referring to FIGS. 1 and 2, consider the requirement to generate a waveform that is a maximum of plus or minus 5 volts, which can be shifted by an offset voltage of plus or minus 5 volts. At maximum positive offset, the waveform swings between 0 and +10 volts. At maximum negative offset, the waveform swings between 0 and −10 volts.

Now consider that this plus or minus 5 volt waveform is created in digital form with a resolution of 8 bits (256 steps) shown in FIG. 1. Then the waveform step size is 10/256=40 mV. Similarly, the plus or minus 5 volt offset is created with a resolution of 8 bits. Similarly, the offset may be adjusted with a precision of 40 mV. Now consider that these digital waveforms are added together while in digital form (that is, the combined waveform and offset are computed digitally) and then converted into an analog signal by a digital-analog converter (FIG. 2).

The addition of two 8-bit numbers generates a 9 bit result. To achieve 256 step resolution in the waveform requires that the plus 10 volt to −10 volt output range of the computed waveform be generated with a resolution of 512 steps (9 bits), that is, that the 9 bit result be converted to an analog signal by a 9 bit digital-analog converter. This is inconvenient, because (a) digital information is generally manipulated in 8 bit bytes (b) digital-analog converters are not available with 9 bit resolution (512 steps). That is, the waveform can exist anywhere in the region between +10V and −10V, placed with a precision of 20/512=40 mV, as required. It would be necessary in this case to use a 10 bit D-A converter.) A 10-bit D-A converter could be used, but all-other-things-being-equal, it will be more expensive than an 8 bit converter. (One option is to discard the least significant bit of the addition, thereby generating an 8 bit result which can be converted conveniently by an 8 bit D-A converter into an analog signal. However, that approach sacrifices resolution, and the step size doubles to 80 mV.)

Digital Generation of Amplitude

Figure 3:
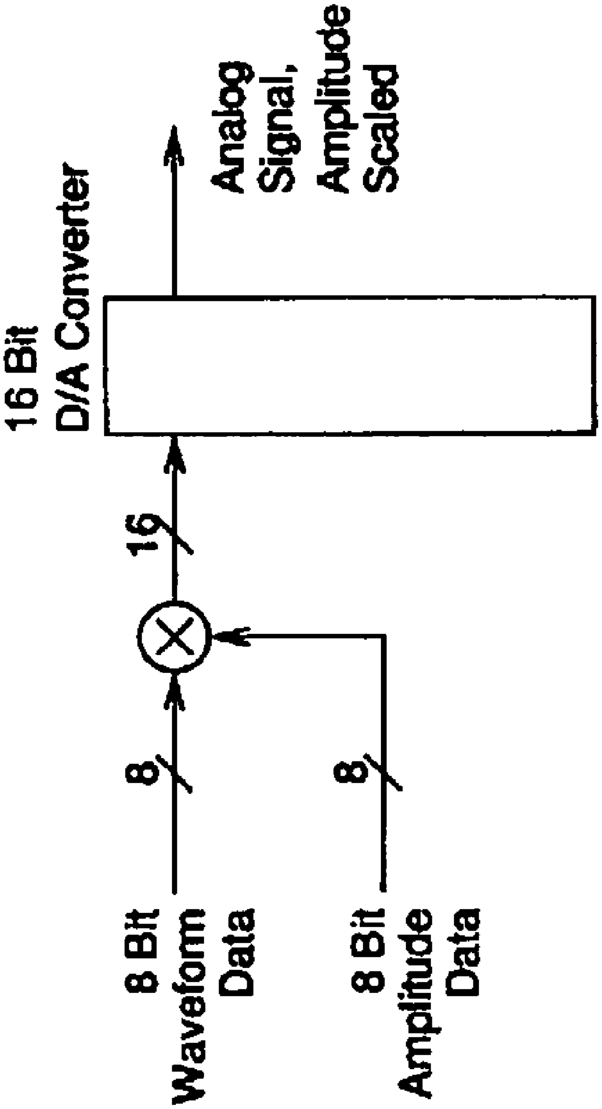
(PRIOR ART) FIGURE 3
FIG. 3 is a block diagram of a prior art circuit wherein the waveform amplitude may be scaled.

The amplitude of the waveform may be adjusted by some form of digital computation in dedicated digital circuitry, a microprocessor or a digital signal processor. The block diagram for this approach is shown in FIG. 3.

Again using our example of 8 bit quantities, the waveform is specified by an 8 bit binary number, that is, with a resolution of 1 part in 256. Similarily, the amplitude is specified with an 8 bit quantity, so that there are now 256 possible steps in the amplitude of the waveform. The multiplication produces a 16 bit product. The 16 bit product is converted to an analog value by a 16 bit digital to analog converter. A maximum digital value of FFFF (hexadecimal notation) produces the maximum analog output.

Figure 4:
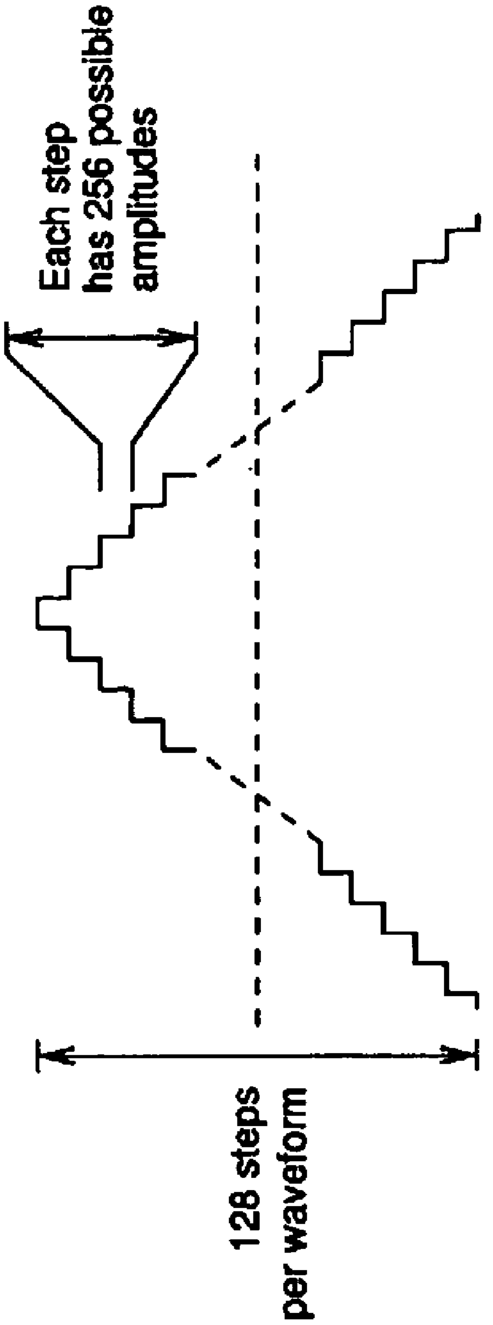
(PRIOR ART) FIGURE 4
FIG. 4 is a graph of the waveform with the amplitude scaled by using the prior art device of FIG. 3.

Viewing the output waveform, one would see a series of steps in each waveform. There would be 255 vertical steps in the waveform. The magnitude of each step would vary over an 8 bit (256:1) range (FIG. 4).

The disadvantages of this scheme are:

(a) The digital computing circuitry must be able to do multiplications at high speed in order to generate the waveform values at the necessary rate.

(b) The digital computing circuitry must be able to produce 16 bit values at the waveform sample rate.

(c) The digital-analog converter must be a 16 bit device. All of these functions can be obtained at a price, but they add substantially to the expense of the components.

(One option is to discard the least significant 8 bits of the multiplication, thereby generating an 8 bit result which can be converted conveniently by an 8 bit D-A converter into an analog signal. However, as the amplitude of the waveform decreases the number of bits specifying the amplitude becomes smaller, and the resolution of the waveform decreases. For example, at minimum amplitude the waveform is specified by one bit, that is, it inevitably becomes a square wave.)

Analog Computing Method

Figure 5:
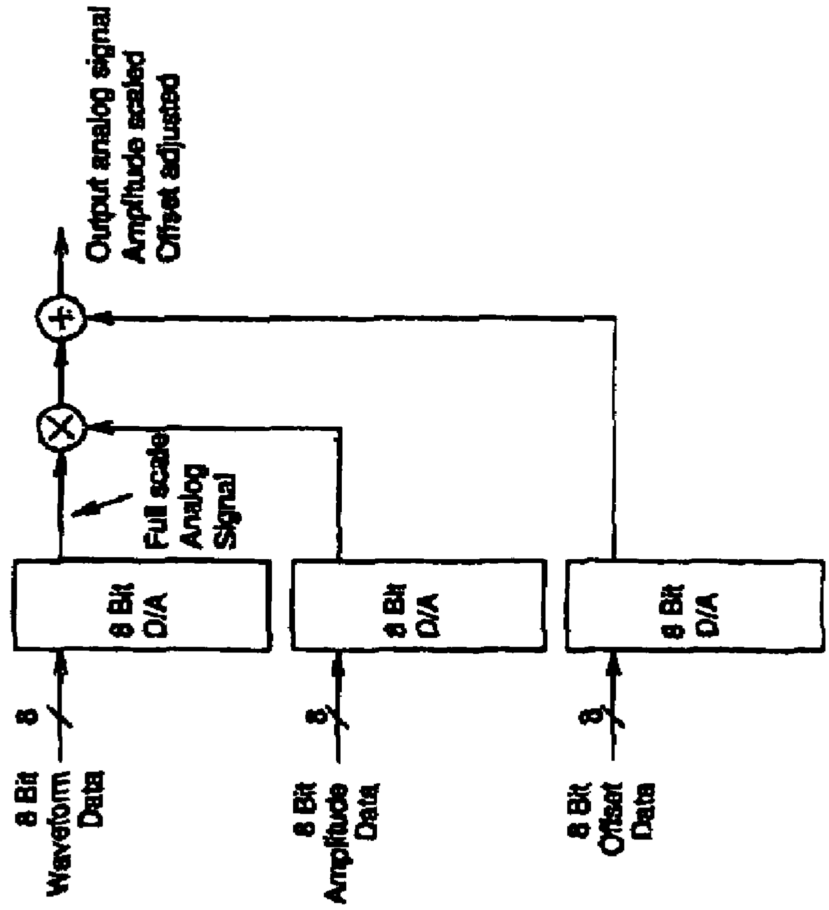
(PRIOR ART) FIGURE 5
FIG. 5 is a block diagram of a prior art alternate circuit for controlling amplitude and offset.

An alternative method for computer control of amplitude and offset is shown in FIG. 5. In this scheme, the waveform is specified by the digital waveform generator as an 8 bit stream of numbers and then converted to an analog waveform by a D-A converter. The waveform amplitude is then adjusted by an analog multiplier (or similar device, such as an OTA: operational transconductance amplifier). This amplitude scaled waveform is then added to the required offset in an analog adder, such as an operational amplifier two-input adder circuit. The control signal for the multiplier and the control signal for the offset circuit are produced by corresponding D-A converters. The advantages of this circuit are:

- it maintains the resolution of the waveform, because the step size scales as the amplitude is changed.
- the waveform resolution, the amplitude and the offset all have the same 8 bit resolution, and so inexpensive 8 bit D-A converters can be used.

As a disadvantage, the analog multiplier and adder must operate in a linear fashion to avoid distorting the signal and must operate at the output signal frequency. These parts add to the cost of the circuit.

MDAC Method

Figure 6:
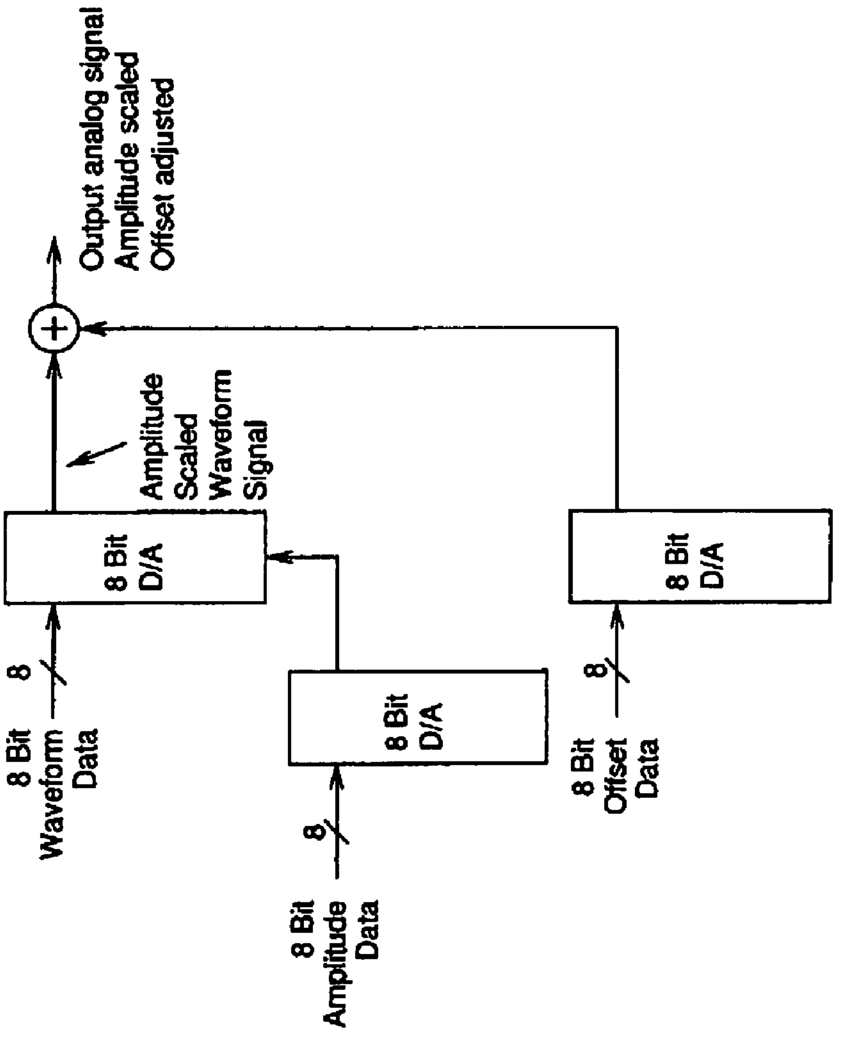
(PRIOR ART) FIGURE 6
FIG. 6 is a block diagram of a prior art alternate method of controlling amplitude and offset.

An MDAC is a multiplying digital to analog converter, that is, it produces an output that is the product of some analog input (voltage or current) and the digital input (a binary number). The multiplier in FIG. 5 may be eliminated if the waveform digital-analog converter is a multiplying D-A converter. This configuration is shown in FIG. 6. The amplitude D-A converter controls the analog input of the waveform D-A, so that the output of the waveform D-A converter can be controlled in amplitude. With this arrangement, the amplitude D-A converter effectively controls the step size of the output analog waveform, so the resolution remains unchanged as the waveform magnitude changes. (This is a known technique: see 'Linear and Conversion Applications Handbook, Precision Monolithics Inc, 1986, Application Note 1777, FIG. 30.)

Voltage Switching vs Current Steering D-A Converter

Digital-Analog converters fall into two groups: voltage-switching and current-steering. The former class of devices produces a voltage output (low internal resistance) and responds relatively slowly to changing inputs. The current steering class produces a current output (high internal resistance) and switches relatively quickly. The maximum generator frequency is dependent on the speed of the waveform D-A converter, so to produce waveform frequencies in the 100's of KHz, the waveform D-A converter must be a current-steering type.

The output current of the waveform D-A converter must be summed with a current from the offset D-A converter. It is well known that this can be accomplished using a virtual-earth input operational amplifier circuit. However, there are practical difficulties in that approach:

The op-amp adder is operated at approximately 100% feedback, so it must be stable in that configuration. This may require a tradeoff in the speed of the circuit.

The virtual earth point is sensitive to noise because it connects directly into the op-amp input. Consequently, the input leads must be kept very short to avoid picking up noise from nearby digital circuitry.

The circuit proposed in this application does not require a summing op-amp or virtual earth point. The output currents of the waveform D-A converter and the offset D-A converter are summed in a current-mirror system, and then converted into a signal voltage by means of a resistor.

Present Invention

Figure 7:
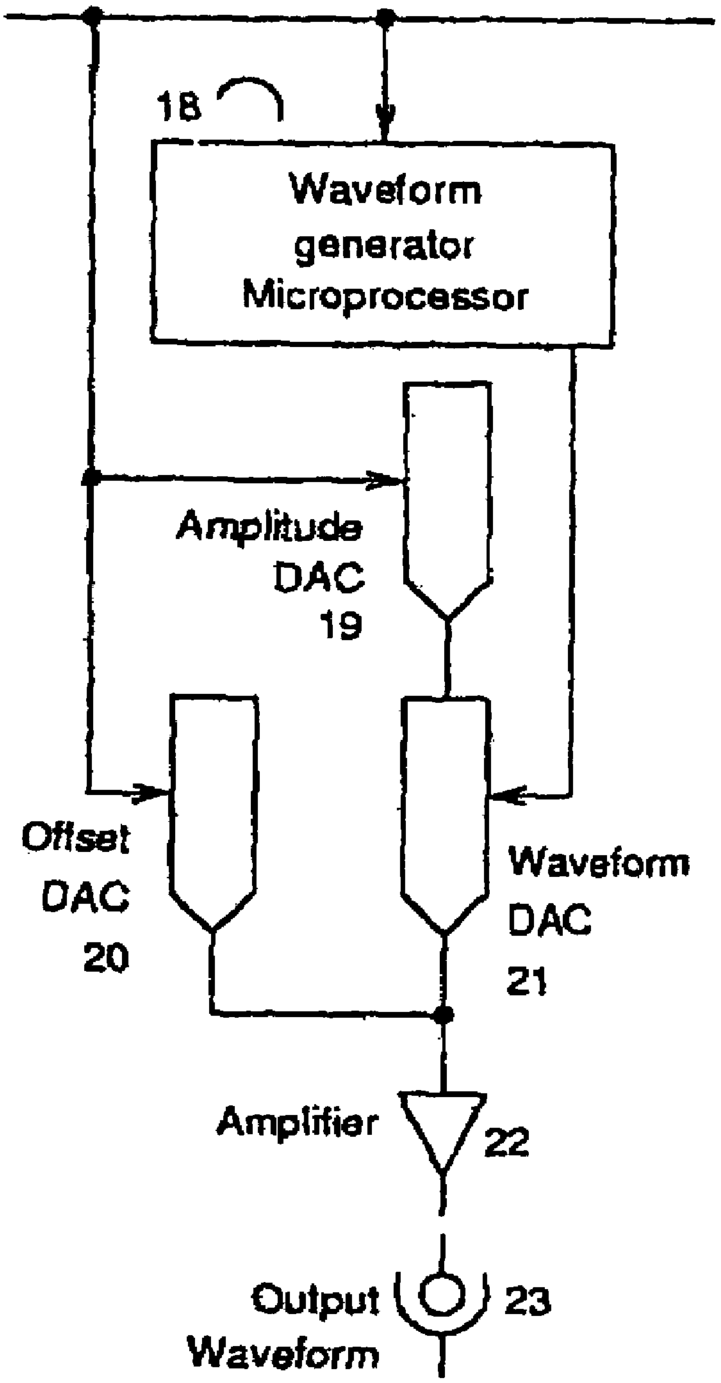
FIG. 7 is a block diagram of a waveform control device of the present invention.

The communications microprocessor sets up control values for the waveform shape and frequency, at the input of the waveform generator microprocessor (18), shown in FIG. 7. The waveform generator microprocessor then produces a stream of digital numbers at the appropriate frequency which are converted into a current waveform by the Waveform DAC (21). The Amplitude DAC (19) adjusts the amplitude of this current waveform and the Offset DAC (20) adjusts the offset. A buffer amplifier (22) converts the current waveform into a voltage waveform and provides the waveform at the Output Waveform connector (23) at low impedance.

The current embodiment of the waveform generator is based on a microprocessor executing a digital program, but this could alternatively be based on digital hardware.

In the waveform generator the shape and frequency of the waveform are created by a microprocessor or special-purpose digital hardware, that generates a stream of numbers. Each number represents a point on the waveform. Then this stream of digital numbers may be converted into a waveform of voltage or current vs time by a digital-analog converter.

Adjustment of the amplitude and offset can be performed as digital number manipulations that precede the digital-analog conversion. The amplitude adjustment is performed by multiplying the waveform data by a constant value. The offset adjustment is performed by further adding a constant value. However, performing these arithmetic operations at the speed necessary to generate a reasonable frequency waveform requires a powerful microprocessor (DSP, DIGITAL SIGNAL PROCESSOR) or special purpose hardware.

An alternative approach that may be simpler and lower cost is to generate the stream of numbers in a microprocessor or digital hardware, and then adjust the amplitude and offset in external circuitry. In this invention, the waveform is generated as usual by a digital-analog converter and then the amplitude and offset are adjusted by two additional digital-analog converters.

Preferably the digital-analog converters are all identical one-quadrant multiplier, complementary current output devices. These devices are also referred to as current steering digital to analog converters. There are two output currents from the current-steering digital-analog converter. One current called the 'true' current, and the other the 'complement' current. They are related by complementing the binary number that is input to the digital-analog converter.

The true current output may be made equal to the complementary output by reversing (each 0 becomes a 1 and vice versa) the bits of the binary number that is input to the digital-analog converter. Reversing the bits in this manner is referred to as 'complementing the binary number'.

The overall effect is that the true current output increases from zero to its maximum value as the binary input increases. The complementary current output moves in the opposite direction: it decreases from its maximum value to zero as the binary input increases.

Figure 8:
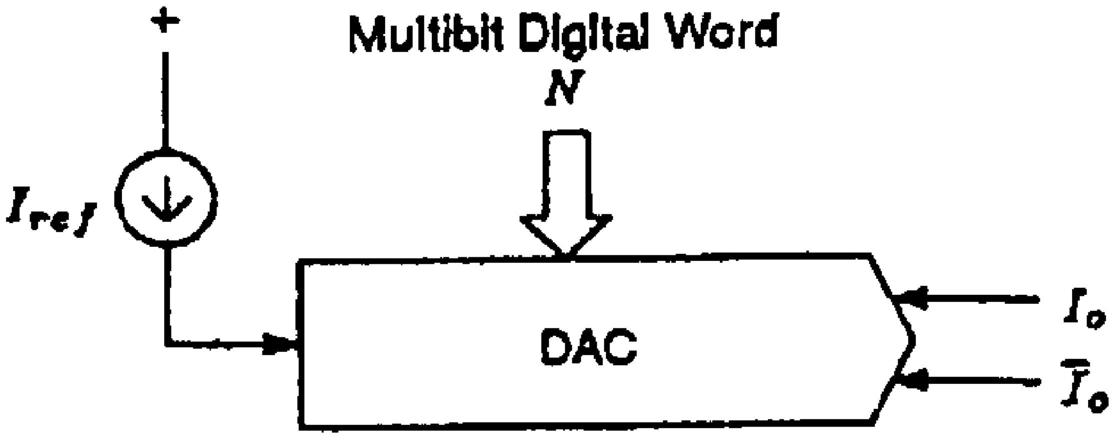
FIG. 8 is a block diagram of a typical complementary-output-current digital-analog converter.

As shown in FIG. 8, a current steering digital to analog converter accepts a reference current $I_{ref}$ and a digital word N, and produces two currents $I_o$ and $\bar{I}_o$.

The value of the current $I_o$ is:

$$I_o = \frac{N}{N_{\max}} I_{ref} \tag{1}$$

where $N_{max}$ is the maximum value of the digital word, given by $2^{NB}-1$, where NB is the number of binary bits in the controlling digital word. For example, in an 8 bit system, $$N_{max}=2^{NB}-1=2^8-1=255 \tag{2}$$

The complementary output current $\bar{I}_o$ is:

$$\bar{I}_o = \left(1 - \frac{N}{N_{\max}}\right) I_{ref} \tag{3}$$

Figure 9:
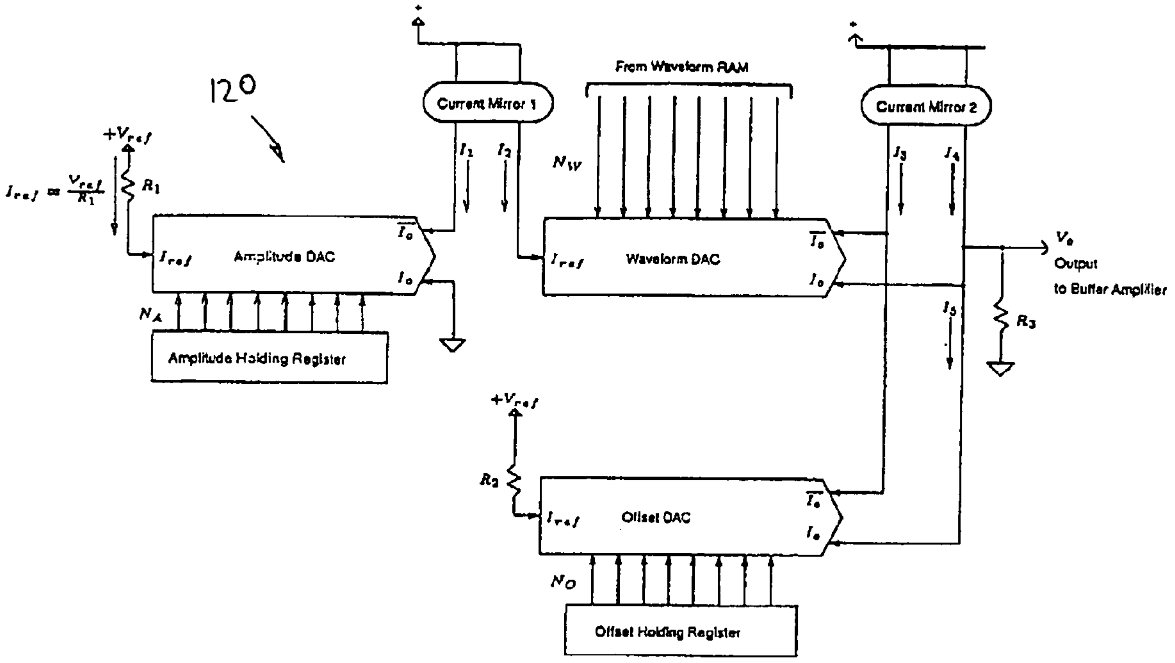
FIG. 9 is a circuit diagram of the function of the offset-amplitude control circuit of the present invention.

FIG. 9 shows the form of amplitude and offset waveform control of the present invention generally at 120. The output current of the AMPLITUDE DAC is established by its reference current $I_{ref}$ and the digital number $N_A$, which has been stored by some means in the AMPLITUDE HOLDING REGISTER. In this embodiment, the reference current input to the DAC is held close to ground potential and the reference current is created by a reference voltage and resistor:

$$I_{ref}=V_{ref}/R_1 \tag{4}$$

The AMPLITUDE DAC, via CURRENT MIRROR 1, sets up a reference current in the WAVEFORM DAC. The current mirror forces $I_1=I_2$ so that the reference current of the WAVEFORM DAC is equal to the output current of the AMPLITUDE DAC. The output currents of the waveform DAC are proportional to its reference current, so the AMPLITUDE DAC can adjust the magnitude of the output currents from the WAVEFORM DAC. The WAVEFORM DAC generates time-varying currents that are proportional to the reference current into this DAC and the stream of digital numbers $N_W$ that define the waveform.

The OFFSET DAC generates two complementary currents which are proportional to its reference current and its digital setting $N_O$. The reference current of the OFFSET DAC is made equal to the reference current of the AMPLI- TUDE DAC. (For example, they may operate from equal reference voltages with $R_1$ equal to $R_2$.) These currents are added to the output currents of the WAVEFORM DAC and mirrored by CURRENT MIRROR 2 so that $I_3$ is forced to be equal to $I_4$. The effect is to add a DC offset current to the output of the AMPLITUDE DAC.

The output current into resistor $R_3$ is the difference between $I_4$ and $I_5$. This current generates a voltage across $R_3$ that is buffered and then becomes the output voltage waveform of the instrument.

If resistors $R_1$ and $R_3$ are made equal, then the governing equation for this configuration is:

$$V_o = V_{ref}\left[\frac{N_A}{N_{\max}}\left(2\cdot\frac{N_W}{N_{\max}}-1\right)+\left(2\cdot\frac{N_O}{N_{\max}}-1\right)\right] \quad (5)$$

where:

$V_o$ is the output voltage, which is subsequently buffered and fed to the output connector;

$V_{ref}$ is the reference voltage;

$N_A$ is the digital amplitude setting, 0 to $N_{max}$. A value of 0 reduces the output signal to zero. A value of $N_{max}$ sets the output signal to its maximum value; and $N_W$ is the digital value of the waveform, which varies over the range 0 to 255 in one cycle. The values of $N_W$ are generated by the digital waveform generation circuit. The values of amplitude $N_A$ and offset $N_O$ are controlled by the operator via some digital circuit mechanism.

It is well known that signals can operate at higher speeds if they are in the form of currents rather than voltages. A voltage signal must charge and discharge stray capacitance, which tends to reduce the maximum allowable frequency of the signal. A current signal is slowed down by stray inductance, but in practice this is a much less severe effect. Because this system manipulates the signals primarily in current form, it exploits the maximum frequency capability of the circuitry.

Figure 11:
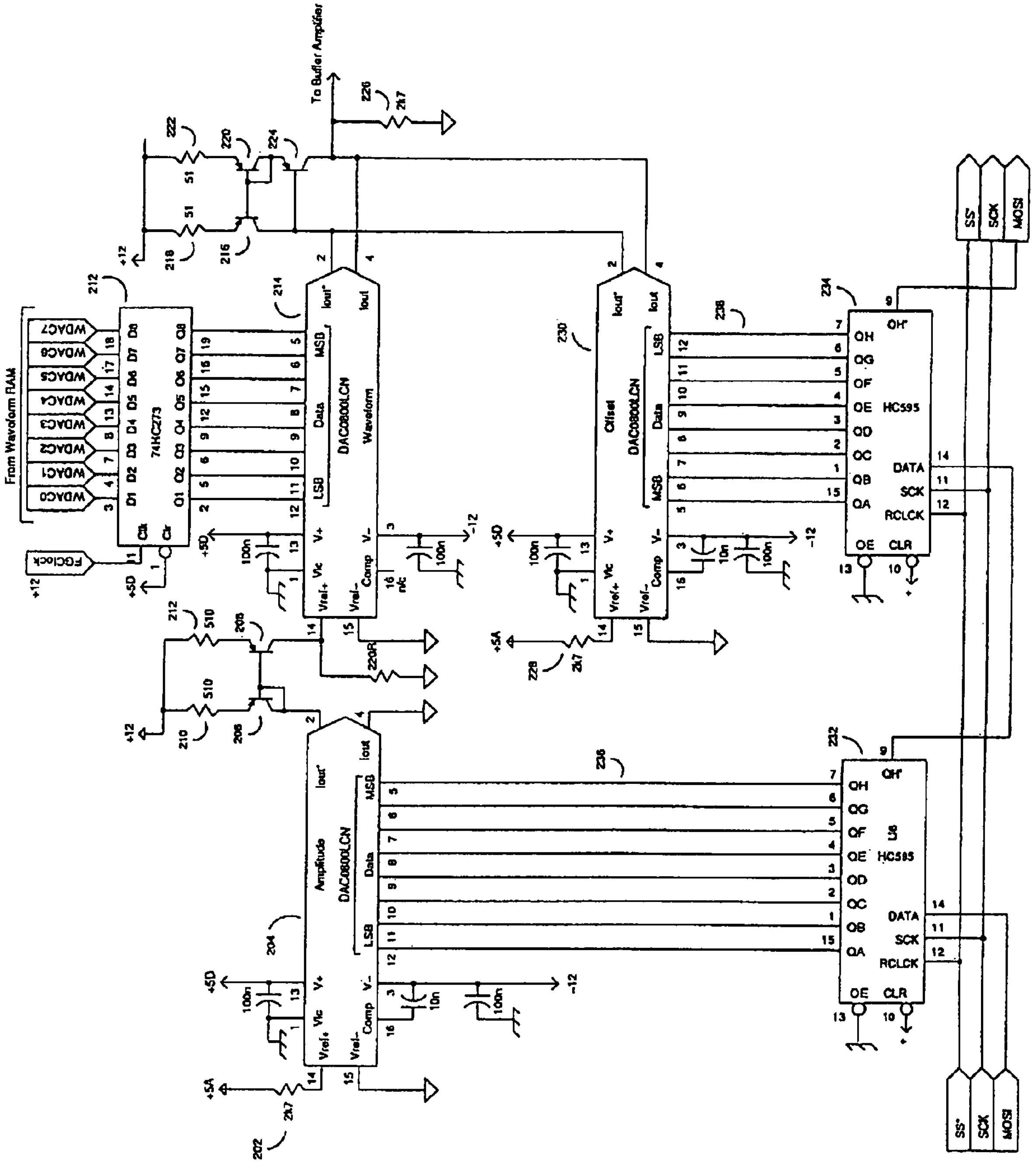
FIG. 11 is a detailed schematic diagram of the preferred embodiment of the offset-amplitude control circuit of the present invention.

The preferred embodiment of the system is shown in FIG. 11. Integrated circuit 204 is the amplitude control DAC (digital to analog converter) for the waveform DAC 214. The offset DAC is item 230.

Amplitude information and offset information are stored in two shift and store registers, 232 and 234, operated by the serial peripheral interface, SPI from a microprocessor. The 8 bit offset information, followed by the 8 bit amplitude information, are shifted into these registers and appear at the 8 bit digital control lines 236 and 238 for their respective D-A converters.

Waveform information appears at the 8 bit digital control lines of the waveform DAC 214, via 8 bit latch 212. The latch is an intermediate storage for waveform information and is loaded at the clock rate of the instrument. Its purpose is primarily to isolate the waveform DAC 214 from digital noise on the waveform data lines.

The reference currents for the amplitude and offset DACs are provided by resistors 202 and 228, connected to the positive supply voltage. The output current of the amplitude DAC 204 appears at pin 2 of that DAC and drives the two-transistor current mirror 206,208. The 510 ohm resistors 210, 212 equalize the current in the transistors for differences in their base-emitter voltages. The mirrored current from the collector of the transistor 208 is thus equal to the output current of the amplitude DAC, and is used as the reference current for the waveform DAC 214.

The output currents of the waveform DAC 214 appear at pins 2 and 4 of that device. They are combined with the output currents of the offset DAC 230, which appear at pins 2 and 4 of that device. A Wilson current mirror is composed of transistors 216, 220 and 224. It reflects the combined currents from pin 2 of the waveform DAC 214 and pin 2 of the offset DAC 230 so that the current through resistor R3 creates a voltage given by the equation for $V_o$ above. The 51 ohm resistors 218, 222 equalize the currents in the two sides of the Wilson current mirror, for differences in their base-emitter voltages.

The capacitors in the circuit provide power supply decoupling and compensation for the DACs, as recommended by their manufacturer.

FIG. 9 shows a system that uses 8 digit numbers throughout. The same circuit can be extended to use any other number of digits.

Figure 10:
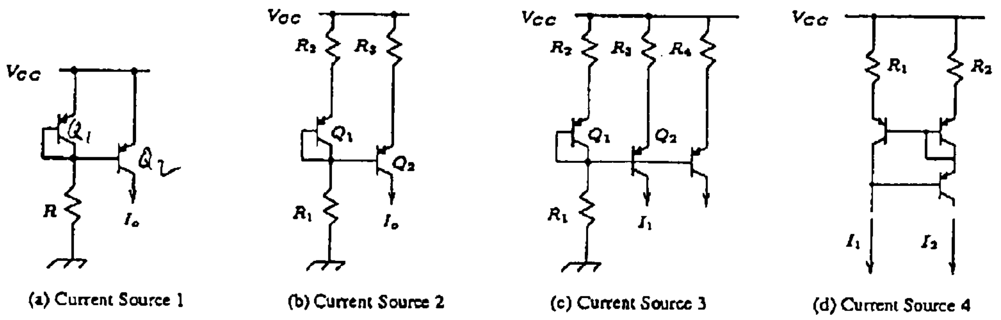
FIGS. 10 *a*), *b*), *c*), and *d*) are circuit diagrams showing some possible variations on the current sources used in the offset-amplitude control circuit of the present invention.

The two reference currents in FIG. 9 are generated by placing a reference voltage $V_{ref}$ across resistors $R_1$ and $R_2$. A wide variety of alternate current sources are possible, as shown in FIGS. 10(*a*) through (*d*). FIG. 10(*a*) is a circuit that would be suitable for an integrated-circuit implementation, where the diode-connected transistor $Q_1$ is matched to transistor $Q_2$. FIG. 10(*b*) shows a similar circuit that can use discrete, unmatched transistors. Resistors $R_1$ and $R_2$ are made equal and equalize the currents in the two transistors. FIG. 10(*c*) shows a circuit that can generate two equal reference currents. FIG. 10(*d*) is the WILSON current source that presents an internal resistance that is larger than the circuits in FIG. 10(*a*) through 10(*c*).

As used herein, the terms "comprises" and "comprising" are to be construed as being inclusive and opened rather than exclusive. Specifically, when used in this specification including the claims, the terms "comprises" and "comprising" and variations thereof mean that the specified features, steps or components are included. The terms are not to be interpreted to exclude the presence of other features, steps or components.

It will be appreciated that the above description related to the invention by way of example only. Many variations on the invention will be obvious to those skilled in the art and such obvious variations are within the scope of the invention as described herein whether or not expressly described.

What is claimed as the invention is:

1. A method of controlling a digitally generated waveform comprising the steps of:

receiving waveform data into a first digital to analog converter to produce a basic current waveform;

receiving amplitude data into a second digital to analog converter to produce a predetermined scale factor which is applied to the basic current waveform to produce a scaled current waveform and a complementary scaled current waveform; and receiving offset data into a third digital to analog converter to produce a predetermined offset value and a complementary offset value that is added to the scaled current waveform and the complementary scaled current waveform to produce a final current waveform.

2. A method as claimed in claim 1 wherein the third digital to analog converter is a current steering digital to analog converter.

3. A method as claimed in claim 2 wherein the first digital to analog converter is a current steering digital to analog converter.

4. A method as claimed in claim 3 wherein the second digital to analog converter is a current steering digital to analog converter.

5. A method as claimed in claim 4 further including the step of receiving the amplitude data into an amplitude storage device and where the second digital to analog converter receives the amplitude data from the amplitude storage device.

6. A method as claimed in claim 5 further including the step of receiving the offset data into an offset storage device and where the third digital to analog converter receives the offset data from the offset storage device.

7. A method as claimed in claim 6 wherein the waveform data, the amplitude data and the offset data are received from a microprocessor.

8. A method as claimed in claim 7 wherein the waveform data is generated by the microprocessor.

9. A method as claimed in claim 8 wherein microprocessor receives the amplitude data and the offset data from a personnel computer.

10. A device for controlling a digitally generated waveform comprising;

a means for producing a basic current waveform;

a means for receiving amplitude data and producing a predetermined scale factor which is applied to the basic current waveform to produce a scaled current waveform and a complementary scaled current waveform; and an offset digital to analog converter for receiving offset data and producing a predetermined offset value and a complementary scale value that is added to the scaled current waveform and the complementary scaled current waveform to produce a final current waveform.

11. A controlling device as claimed in claim 10 wherein the means for producing a basic current waveform is a first digital to analog converter.

12. A controlling device as claimed in claim 11 wherein the means for receiving amplitude data is a second digital to analog converter.

13. A controlling device as claimed in claim 12 wherein the offset digital to analog converter is a current steering digital to analog converter.

14. A controlling device as claimed in claim 13 wherein the first digital to analog converter is a current steering digital to analog converter.

15. A controlling device as claimed in claim 14 wherein the second digital to analog converter is a current steering digital to analog converter.

16. A controlling device as claimed in claim 15 further including an amplitude storage device for receiving the amplitude data and providing it to the second digital to analog converter.

17. A controlling device as claimed in claim 16 further including an offset storage device for receiving the offset data and providing it to the third digital to analog converter.

18. A controlling device as claimed in claim 17 further including a microprocessor for providing the waveform data, the amplitude data and the offset data.

19. A controlling device as claimed in claim 18 wherein the waveform data is generated by the microprocessor.

20. A controlling device as claimed in claim 19 wherein the device is operably attached to a personnel computer and wherein the personnel computer provides the amplitude data and the offset data to the microprocessor.

21. A circuit for offsetting a waveform comprising:

a means for generating a current waveform and a complementary current waveform;

a current steering digital to analog converter having complementary current output terminals;

a current mirror wherein the complementary current output terminals of the current steering digital to analog converter are operably connected to the current mirror through the current waveform and the complementary current waveform to produce an offset current waveform.

22. An offset circuit as claimed in claim 21 wherein means for generating a current waveform is a waveform digital to analog converter.

23. An offset circuit as claimed in claim 22 wherein the waveform digital to analog converter is a second current steering digital to analog converter.

* * * * *